United States Patent
Fukui et al.

(10) Patent No.: US 8,130,570 B2
(45) Date of Patent: Mar. 6, 2012

(54) DATA TRANSFER CIRCUIT

(75) Inventors: Akihiko Fukui, Kanagawa-ken (JP); Naoki Kiryu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/888,682

(22) Filed: Sep. 23, 2010

(65) Prior Publication Data

US 2011/0075494 A1 Mar. 31, 2011

(30) Foreign Application Priority Data

Sep. 25, 2009 (JP) ................. 2009-220165

(51) Int. Cl.
*G11C 7/10* (2006.01)
(52) U.S. Cl. ................. 365/189.17; 365/233.5
(58) Field of Classification Search ............. 365/189.17, 365/233.5
See application file for complete search history.

(56) References Cited

U.S. PATENT DOCUMENTS

2009/0037786 A1 * 2/2009 Wang et al. ................... 714/731

FOREIGN PATENT DOCUMENTS

JP 2010182366 8/2010

* cited by examiner

*Primary Examiner* — Michael Tran
(74) *Attorney, Agent, or Firm* — Turocy & Watson, LLP

(57) ABSTRACT

A data transfer circuit includes: an asynchronous memory to which transfer data is written from a first clock domain with a first clock and from which the written transfer data is read to a second clock domain with a second clock; a scan flip-flop whose input terminal is connected to a first position located on a data path, of the transfer data, from the asynchronous memory to the second clock domain, and whose output terminal is connected to a second position located on a data path, of the transfer data, from the asynchronous memory to the first position; and a clock selector which selects a clock to drive the scan flip-flop from the first clock and the second clock.

10 Claims, 4 Drawing Sheets

DATA TRANSFER CIRCUIT

CROSS-REFERENCE TO RELATED APPLICATIONS

This application is based upon and claims the benefit of priority from the prior Japanese Patent Application No. P2009-220165, filed on Sep. 25, 2009; the entire contents of which are incorporated herein by reference.

BACKGROUND

1. Field

Embodiments described herein relate generally to a data transfer circuit.

2. Description of Related Art

In the testing of a memory mounted on a semiconductor integrated circuit using a memory BIST (built-in self-test) and of a logic area around the memory using a scan test, paths at a boundary between the memory and a peripheral circuit of the memory are likely to be missed by the tests (see Patent Documents 1 and 2, for example). In the case where a memory is placed at a boundary between two different clock domains (hereinafter simply called an asynchronous boundary) as means for sending and receiving data between the clock domains, in particular, there is a path, around the memory, which neither the memory BIST nor the scan test can cover. In conventional cases, a function test is often required to be additionally employed to test this path. In general, the function test takes long test time. Further, the identification of defective locations for the analysis of defective products is difficult in the function test. For these reasons, the function test is not suitable for use in a mass production test.

DETAILED DESCRIPTION

Figure 1:
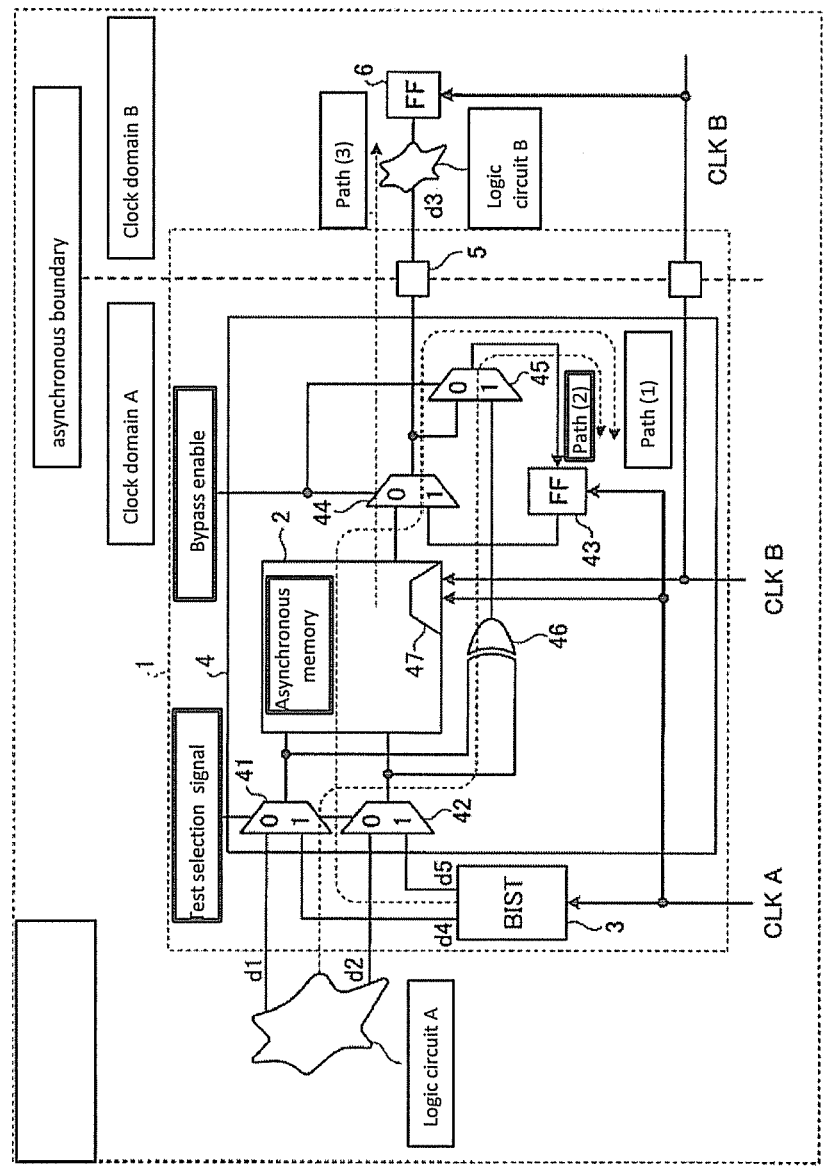
FIG. 1 is a diagram illustrating an example of a data transfer circuit.

First of all, in order to facilitate understanding, an example of a data transfer circuit is shown to illustrate a path which neither a memory BIST nor a scan test can cover. FIG. 1 is a diagram illustrating an example of a data transfer circuit.

As shown in FIG. 1, a semiconductor integrated circuit includes a clock domain A operating with a clock A (CLK A) and a clock domain B operating with a clock B (CLK B). The semiconductor integrated circuit also has a data transfer circuit 1 connected to both of the clock domains A and B. The data transfer circuit 1 includes an asynchronous memory 2 operating with both of the clocks A and B for transferring data from the clock domain A to the clock domain B across a boundary (asynchronous boundary) between these two domains. Here, the clock B has a lower rate than the clock A.

A logic circuit A of the clock domain A is connected to the data transfer circuit 1 with a data line d1 and a signal line d2. The data line d1 is used to transfer data to a logic circuit B of the clock domain B. The signal line d2 is used to send a control signal to control the asynchronous memory 2 for the data. The data transfer circuit 1 is connected to the logic circuit B with an output line d3. The output line d3 is used to output data written to the asynchronous memory 2 and to be transferred to the logic circuit B. The data transfer circuit 1 is provided with the clocks A and B.

The data transfer circuit 1 includes a memory BIST circuit (hereinafter simply called a BIST circuit) 3 for testing the asynchronous memory 2. The BIST circuit 3 checks whether or not a fault exists in the asynchronous memory 2 or in a path for test data by writing test data into the asynchronous memory 2, reading the written test data, and comparing the read test data (BIST read data) with an expected value. The BIST circuit 3 outputs to a data line d4 test data to be written into the asynchronous memory 2, and outputs to a signal line d5 a control signal for making the asynchronous memory 2 perform the test operation, respectively.

The asynchronous memory 2 is included in a block called a memory collar (memory collar 4) together with a peripheral circuit for making the asynchronous memory 2 perform the ordinary operation and the test operation.

The memory collar 4 includes multiplexers 41 and 42. The data line d1 from the logic circuit A and the data line d4 from the BIST circuit 3 are connected to the input terminals of the multiplexer 41, whereas the signal line d2 from the logic circuit A and the signal line d5 from the BIST circuit 3 are connected to the input terminals of the multiplexer 42. The output terminals of the multiplexers 41 and 42 are connected to the data input terminal and the signal input terminal of the asynchronous memory 2, respectively. The multiplexers 41 and 42 can select whether to connect the input terminal of the asynchronous memory 2 to the logic circuit A or to the BIST circuit 3.

The memory collar 4 includes a flip-flop (FF) 43. The FF 43 is used as a capture register for capturing the BIST read data read from the asynchronous memory 2. The FF 43 is a scan flip-flop, and is thus used for the fault check, using the scan test, of a path from the logic circuit A to the FF 43 as well.

To be more specific, the output terminal of the asynchronous memory 2 is connected to the input terminal of the FF 43 through two-stage multiplexers (multiplexers 44 and 45). The data line from the output terminal of the multiplexer 44 is branched into two lines at a position between the output terminal of the multiplexer 44 and an input terminal of the multiplexer 45 (first position). One of the branched lines is connected to the input terminal of the multiplexer 45, whereas the other is connected to a port 5 at the asynchronous boundary. The port 5 and the logic circuit B is connected to each other with the data line d3. The output terminal of the FF 43 is connected to the input terminal of the FF 43. In other words, a data path from the asynchronous memory 2 to the clock domain B is branched into two lines at the first position, and one of the branched lines is connected to the input terminal of the FF 43. The output terminal of the FF 43 is connected to an input terminal of the multiplexer 44 as a second position.

The data line from the output terminal of the multiplexer 41 to the input terminal of the asynchronous memory 2 and the signal line from the output terminal of the multiplexer 42 to the input terminal of the asynchronous memory 2 are each branched into two lines, and one of the branched data lines and one of the branched signal lines are connected to the input terminals of an EXOR circuit 46, respectively. The EXOR circuit 46 performs EXOR calculation to reduce the bit width of these two input terminals to the bit width of the data line d3. The output terminal of the EXOR circuit 46 is connected to an input terminal of the multiplexer 45. In other words, the data paths (including the path of a control signal) from the logic circuit A to the asynchronous memory 2 are each branched into two lines at a branch point (third position) located between the logic circuit A and the asynchronous memory 2, and one of the branched lines is connected to an input terminal of the multiplexer 45.

According to a bypass enable signal, the multiplexers 44 and 45 can select whether to connect the output terminal of the asynchronous memory 2 to the input terminal of the FF 43 or connect the output terminals of the multiplexers 41 and 42 to the input terminal of the FF 43 while bypassing the asynchronous memory 2. Note that, when the multiplexers 44 and 45 connect the output terminals of the multiplexers 41 and 42 to the input terminal of the FF 43 while bypassing the asynchronous memory 2, the multiplexer 44 selects the input from the output terminal of the FF 43 out of the output terminal of the asynchronous memory 2 and the output terminal of the FF 43, and outputs the selected input from the output terminal of the multiplexer 44.

The BIST circuit 3 and the FF 43 are supplied with the clock A. The asynchronous memory 2 is supplied with the clocks A and B through a multiplexer 47. The multiplexer 47 selects the clock A when data is written from the logic circuit A, and selects the clock B when data is read from the asynchronous memory 2 and the read data is sent to the logic circuit B.

In the data transfer circuit 1 of the above configuration, the test is executed in the following way. Specifically, a test selection signal is controlled so that the input terminal of the asynchronous memory 2 may be connected to the BIST circuit 3, and a bypass enable signal is controlled so that the output terminal of the asynchronous memory 2 may be connected to the input terminal of the FF 43 (this mode is hereinafter called a BIST mode). By causing the BIST circuit 3 to operate in this mode, the test can be performed on the path from the BIST circuit 3 through the multiplexers 41 and 42, the asynchronous memory 2, the multiplexer 44, and the multiplexer 45 to the FF 43. Meanwhile, the test selection signal is controlled so that the input terminal of the asynchronous memory 2 may be connected to the logic circuit A, and the bypass enable signal is controlled so that the output terminals of the multiplexers 41 and 42 may be connected to the input terminal of the FF 43 with the asynchronous memory 2 being bypassed (this mode is hereinafter called a bypass mode). This forms the path from the logic circuit A, through the multiplexers 41 and 42, the EXOR circuit 46, and the multiplexer 45 to the FF 43, and thus the scan test can be executed on this path. However, since the FFs 43 and 6 are supplied with the different clocks, the scan test cannot be executed on the path from the multiplexer 44 to a first-stage scan flip-flop 6 of the clock domain B which is connected to the multiplexer 44 through the logic circuit B. For this reason, the path from the asynchronous memory 2 to the FF 6 has been heretofore tested with the function test which is not suitable for use in the mass production test. To cope with this, embodiments of the present invention allow the path, having been heretofore tested using the function test, to be tested using the scan test by making the FF 43 operable with the clock B as well.

Hereinbelow, detailed description is given of data transfer circuits according to the embodiments of the present invention with reference to the accompanying drawings. Note that, the present invention is not limited by these embodiments.

FIRST EMBODIMENT

Figure 2:
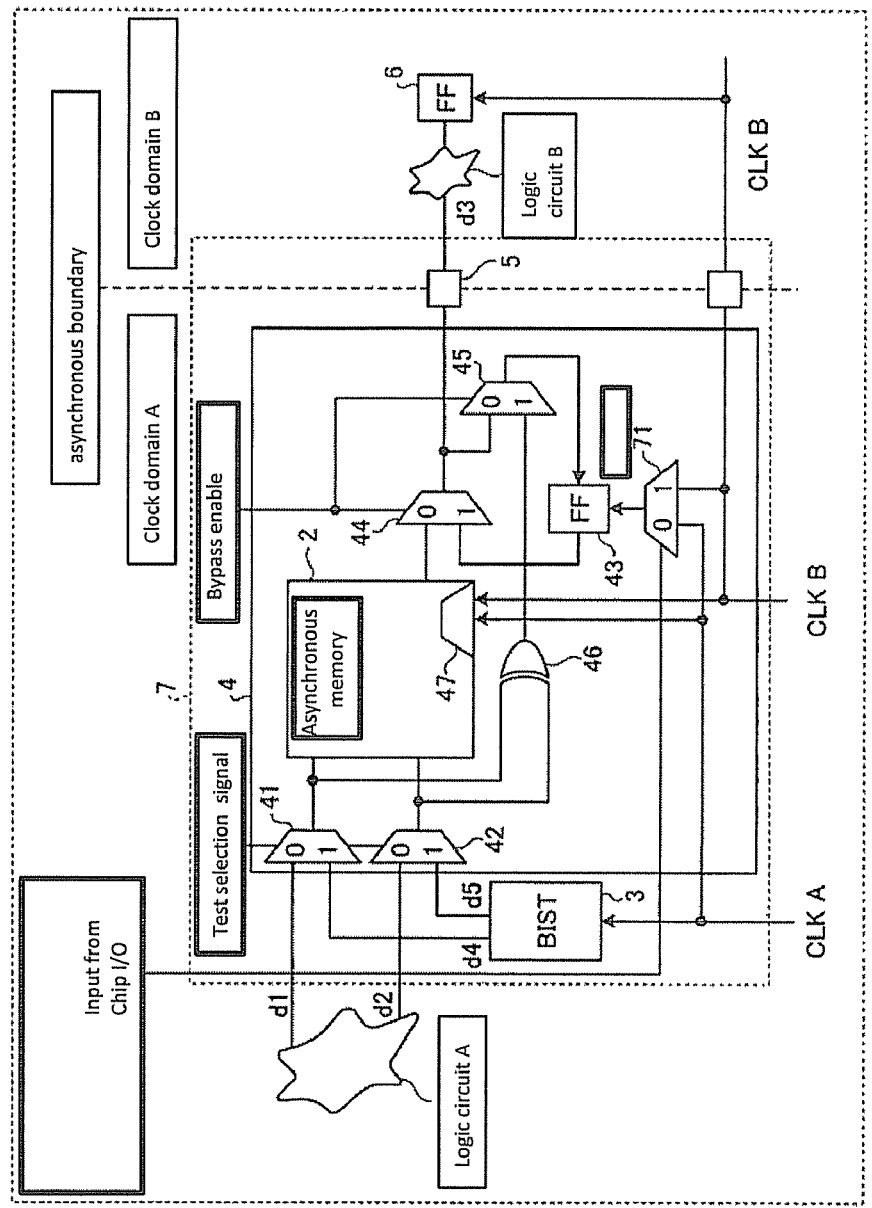
FIG. 2 is a diagram showing a configuration of a data transfer circuit according to a first embodiment of the present invention.

FIG. 2 is a diagram showing the configuration of a data transfer circuit according to a first embodiment of the present invention. As shown in FIG. 2, a data transfer circuit 7 of the first embodiment has a configuration in which a multiplexer 71 as a clock selector is added to the data transfer circuit 1.

The input terminals of the multiplexer 71 are connected to a supply line for the clock A and a supply line for the clock B. The output terminal of the multiplexer 71 is connected to the clock input terminal of the FF 43. According to a signal from an input/output terminal (chip I/O) of the semiconductor integrated circuit (chip), the multiplexer 71 can select whether to supply the FF 43 with the clock A or the clock B.

By causing the multiplexer 71 to select the clock A, as similar to the data transfer circuit 1, the data transfer circuit 7 of the above configuration can execute the test, using the memory BIST, of the path from the BIST circuit 3 through the multiplexers 41 and 42, the asynchronous memory 2, the multiplexer 44, and the multiplexer 45 to the FF 43 in the BIST mode, and allows the execution of the scan test of the path from the logic circuit A through the multiplexers 41 and 42, the EXOR circuit 46, and the multiplexer 45 to the FF 43 in the bypass mode.

Further, by controlling the bypass enable signal so that the multiplexer 44 may output the input from the output terminal of the FF 43, the path is formed from the FF 43 through the multiplexer 44, the port 5, and the logic circuit B to the FF 6. By causing the multiplexer 71 to select the clock B in this state, the data transfer circuit 7 allows the execution of the scan test of the path from the FF 43 through the multiplexer 44, the port 5, and the logic circuit B to the FF 6, which cannot be executed in the data transfer circuit 1, since the FFs 43 and 6 are supplied with the same clock B.

As described above, according to the first embodiment, the data transfer circuit has a configuration in which the clock to drive the FF 43 can be selected from the clocks A and B. With this configuration, the scan test of the path from the FF 43 through the multiplexer 44, the port 5, and the logic circuit B to the FF 6 can be executed. In other words, the data transfer circuit of the first embodiment allows increasing a part that the memory BIST and the scan test can cover as compared to the data transfer circuit 1 shown in FIG. 1.

SECOND EMBODIMENT

In the data transfer circuit 1, the scan test is executed in the bypass mode. In this event, the path is formed from the logic circuit A through the multiplexers 41 and 42, the EXOR circuit 46, the multiplexer 45, the FF 43, the multiplexer 44, the port 5, and the logic circuit B to the FF 6. In the simultaneous execution of the scan test of the clock domains A and B in this mode, since these domains have different clock frequencies, there is a problem that the data transfer circuit needs to mask and neglect an expected value of the FF on the clock domain B side (FF 6 in this specification). To solve this problem, in a second embodiment of the present invention, the data path from the FF 43 to the FF 6 is blocked.

Figure 3:
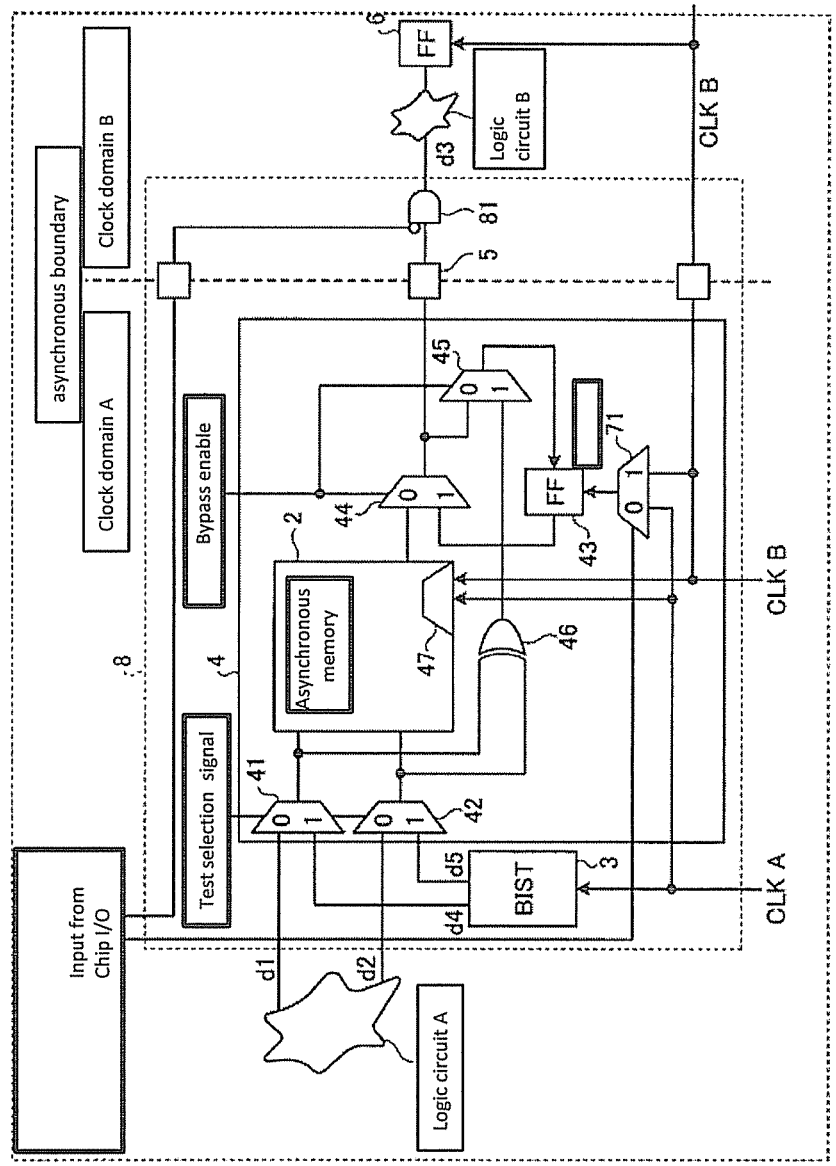
FIG. 3 is a diagram showing a configuration of a data transfer circuit according to a second embodiment of the present invention.
Figure 4:
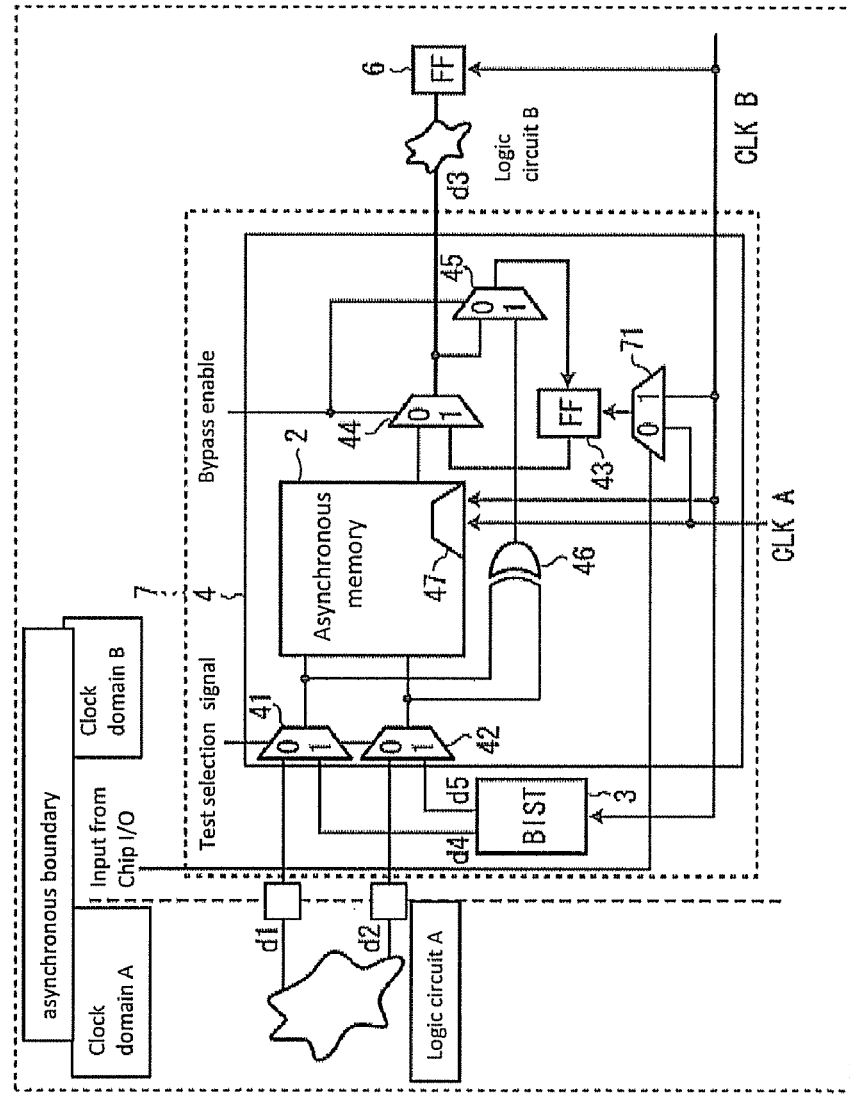
FIG. 4 is a diagram showing a configuration of a data transfer circuit according to a third embodiment of the present invention.

FIG. 3 is a diagram illustrating the configuration of the data transfer circuit of the second embodiment. As shown in FIG. 3, a data transfer circuit 8 includes an AND circuit 81 between the port 5 and the logic circuit B, in addition to the configuration of the first embodiment. The AND circuit 81 blocks the data path between the port 5 and the logic circuit B on the basis of the input from the chip I/O. Note that, another circuit may be employed instead of the AND circuit 81 as long as the circuit is configured to block the data path between the port 5 and the logic circuit B. Moreover, the AND circuit 81 may be connected at any position between the first position and the FF 6.

As described above, according to the second embodiment, the data path from the FF 43 to the FF 6 is blocked in the execution of the scan test. This allows executing the scan test on the clock domain A side and the scan test on the clock domain B side in parallel without masking the expected value of the FF on the clock domain B side.

THIRD EMBODIMENT

In the first and second embodiments, the asynchronous memory 2 is disposed in the clock domain A. In contrast, in a third embodiment of the present invention, description is given of the case where an asynchronous memory 2 is disposed in the clock domain B. Note that, no description is given of the configuration which is the same as that described above.

The asynchronous memory 2 is supplied with the clocks A and B through the multiplexer 47. The multiplexer 47 selects the clock A when data is written from the logic circuit A, and selects the clock B when data is read from the asynchronous memory 2 and the read data is sent to the logic circuit B.

The data transfer circuit of the third embodiment includes the FF 43 and the multiplexer 71. This increases a part that the memory BIST and the scan test can cover as similar to the data transfer circuit of the first embodiment. Moreover, in this embodiment, the asynchronous memory 2 is disposed in the clock domain B. This eliminates the problem due to the different clock frequencies in the simultaneous execution of the scan test of the clock domains A and B, as described in the second embodiment. Accordingly, the configuration in which the data path from the FF 43 to the FF 6 is blocked, which is described in the second embodiment, is no longer required.

What is claimed is:

1. A data transfer circuit which transfers data from a first clock domain operating with a first clock to a second clock domain operating with a second clock different from the first clock, the circuit comprising:
   an asynchronous memory to which transfer data is written from the first clock domain with the first clock and from which the written transfer data is read to the second clock domain with the second clock;
   a scan flip-flop whose input terminal is connected to a first position located on a data path, of the transfer data, from the asynchronous memory to the second clock domain, and whose output terminal is connected to a second position located on a data path, of the transfer data, from the asynchronous memory to the first position; and
   a clock selector which selects a clock to drive the scan flip-flop from the first clock and the second clock, wherein
   a memory BIST is performed with the first clock on a data path from the asynchronous memory through the first position to the scan flip-flop by causing the clock selector to select the first clock, and
   a scan test is performed with the second clock on a data path from the scan flip-flop through the second position and the first position to the second clock domain by causing the clock selector to select the second clock.

2. The data transfer circuit according to claim 1, further comprising a bypass which is connected from a third position to the input terminal of the scan flip-flop without passing through the asynchronous circuit, the third position being located on a data path, of the transfer data, from the first clock domain to the asynchronous memory, wherein
   a scan test is performed with the first clock on a data path from the first clock domain through the bypass to the scan flip-flop by causing the clock selector to select the first clock.

3. The data transfer circuit according to claim 2, further comprising a bypass selector which selects whether to connect the input terminal of the scan flip-flop to the first position or to the bypass.

4. The data transfer circuit according to claim 1, further comprising a block circuit which blocks a data path, of the transfer data, from the first position to the second clock domain, wherein
   the scan test of the first clock domain and the scan test of the second clock domain are executed in parallel.

5. The data transfer circuit according to claim 1, wherein the second clock has a lower rate than the first clock.

6. A data transfer circuit which transfers data from a first logic circuit of a first clock domain operating with a first clock to a second logic circuit of a second clock domain operating with a second clock different from the first clock, the circuit comprising:
   an asynchronous memory to which transfer data is written from the first logic circuit with the first clock and from which the written transfer data is read to the second logic circuit with the second clock;
   a BIST circuit which operates with the first clock and executes a BIST of the asynchronous memory;
   a scan flip-flop which receives anyone of an output from the asynchronous memory and an output from the first logic circuit; and
   a clock selector which selects a clock to drive the scan flip-flop from the first clock and the second clock, wherein
   in a BIST mode, the clock selector is caused to select the first clock so that the output from the asynchronous memory is inputted to the scan flip-flop, and
   in a bypass mode, the clock selector is caused to select the second clock so that the output from the first logic circuit is inputted to the scan flip-flop and that an output from the scan flip-flop is outputted to the second logic circuit.

7. The data transfer circuit according to claim 6, further comprising a block circuit which blocks a data path from the scan flip-flop to the second logic circuit in the bypass mode.

8. The data transfer circuit according to claim 7, further comprising an EXOR circuit which is connected between an output terminal of the first logic circuit and an input terminal of the scan flip-flop, wherein
   the EXOR circuit makes a bit width of the output of the first logic circuit equal to a bit width of the input of the scan flip-flop.

9. The data transfer circuit according to claim 8, wherein the data transfer circuit is disposed in the first clock domain.

10. The data transfer circuit according to claim 9, wherein the second clock has a lower rate than the first clock.

* * * * *